US012588458B2

(12) United States Patent      (10) Patent No.:   US 12,588,458 B2

Kizaki      (45) Date of Patent:    Mar. 24, 2026

---

(54) TAPE AFFIXING APPARATUS AND TAPE MAGAZINE

(71) Applicant: TOKYO SEIMITSU CO., LTD., Hachioji (JP)

(72) Inventor: Kiyotaka Kizaki, Hachioji (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 138 days.

(21) Appl. No.: 18/277,964

(22) PCT Filed: Nov. 12, 2021

(86) PCT No.: PCT/JP2021/041649

§ 371 (c)(1),
(2) Date: Aug. 18, 2023

(87) PCT Pub. No.: WO2022/180944

PCT Pub. Date: Sep. 1, 2022

(65) Prior Publication Data

US 2023/0402301 A1     Dec. 14, 2023

(30) Foreign Application Priority Data

Feb. 24, 2021    (JP) ................................. 2021-027975

(51) Int. Cl.
| | |
|---|---|
| *H01L 21/67* | (2006.01) |
| *B65H 35/00* | (2006.01) |
| *H10P 72/00* | (2026.01) |

(52) U.S. Cl.
CPC ..... *H10P 72/0442* (2026.01); *B65H 35/0013* (2013.01)

(58) Field of Classification Search
CPC .............. H01L 21/67132; H01L 21/30; H01L 21/6836; H01L 2221/68327;

(Continued)

---

(56) References Cited

U.S. PATENT DOCUMENTS

| | | | | |
|---|---|---|---|---|
| 4,285,752 A | * | 8/1981 | Higgins ................ | B29C 70/388 |
| | | | | 226/110 |
| 11,148,373 B2 | * | 10/2021 | Knutson ............... | B29C 70/388 |

(Continued)

FOREIGN PATENT DOCUMENTS

| | | |
|---|---|---|
| JP | H0589359 U | 12/1993 |
| JP | H07307366 | 11/1995 |

(Continued)

OTHER PUBLICATIONS

Decision of Refusal in counterpart Japanese application No. 2021-027975, Dispatch Date Oct. 22, 2024; with English translation; 8 pages.

(Continued)

*Primary Examiner* — George R Koch

*Assistant Examiner* — Christopher C Caillouet

(74) *Attorney, Agent, or Firm* — Fattibene and Fattibene, LLC; Paul A. Fattibene

(57) ABSTRACT

A tape affixing apparatus and a tape magazine capable of automatically switching or replacing a dicing tape. An affixing apparatus 3 includes a base section 31 on which a tape magazine 4 accommodating a dicing tape DT wound in a roll shape with a part of the dicing tape DT reeled out is installed to be replaceably mountable, movable guide rollers 32a and 32b, fixed guide rollers 33a and 33b, and a knife plate 35 that are movable to regulate a reel-out region R where the part of the dicing tape DT is reeled out to a predetermined track.

2 Claims, 7 Drawing Sheets

(58) Field of Classification Search
CPC ........ B65H 35/0013; B65H 2404/1422; B65H 2404/147; B65H 19/123; B65H 35/0033; B65H 2701/37
See application file for complete search history.

(56) References Cited

U.S. PATENT DOCUMENTS

| | | | | |
|---|---|---|---|---|
| 2007/0227648 A1 | 10/2007 | Tsujimoto et al. | ........... | 156/230 |
| 2008/0044258 A1 | 2/2008 | Akechi | ...................... | 414/217.1 |

FOREIGN PATENT DOCUMENTS

| JP | 2005123653 | 5/2005 |
|---|---|---|
| JP | 2005314100 | 11/2005 |
| JP | 2006156633 | 6/2006 |
| JP | 201013287 | 1/2010 |
| JP | 2011086687 | 4/2011 |
| JP | 2013004584 | 1/2013 |
| JP | 2015231031 | 12/2015 |
| JP | 2019110189 | 7/2019 |
| JP | 20200121407 | 10/2020 |

OTHER PUBLICATIONS

Office Action in counterpart Korean application No. 10-2023-7025941, Dispatch Date Dec. 2, 2024; with English translation; 9 pages.
International Search Report, PCT/JP2021/041649, dated Dec. 21, 2021, 2 pages.
International Preliminary Report on Patentability, PCT/JP2021/041649, dated Aug. 3, 2023, 3 pages.
Office Action in counterpart Japanese application No. 2021-027975, Dispatch Date May 21, 2024; with English translation; 9 pages.
Final Notification Office Action in counterpart Korean application No. 10-2023-7025941, Dispatch Date Mar. 21, 2025; with English translation; 12 pages.

\* cited by examiner

TAPE AFFIXING APPARATUS AND TAPE MAGAZINE

TECHNICAL FIELD

The present invention relates to a tape affixing apparatus for a dicing tape and a tape magazine used for this tape affixing apparatus.

BACKGROUND ART

In a semiconductor manufacturing field, there is a process for cutting a semiconductor substrate such as a silicon wafer (hereinafter referred to as a "workpiece") into chips. In the process, a dicing tape affixed to the workpiece restricts a position of each of the chips so that the cutting into the chips can be efficiently performed.

Patent Literature 1 discloses that an expand tape E is affixed to a wafer W adsorbed and fixed to a table 211 with a pressing force of an affixing roller. Reference signs are in Patent Literature 1.

CITATION LIST

Patent Literature

Patent Literature 1: Japanese Patent Laid-Open No. 2013-4584

SUMMARY OF INVENTION

Technical Problem

However, in the apparatus described in Patent Literature 1, when the tape is switched depending on the type of the wafer W or when the tape is replaced as it is consumed, the used expand tape E that is wound around each type of roller and set to pass through a predetermined track is removed, and then a new expand tape E needs to be manually set again to pass through the predetermined track.

Therefore, there occurs a technical problem to be solved to automatically switch or replace a dicing tape, and an object of the present invention is to solve this problem.

Solution to Problem

To attain the above-described object, a tape affixing apparatus according to the present invention is a tape affixing apparatus that affixes a dicing tape to a dicing frame and a workpiece, the tape affixing apparatus including a base section on which a tape magazine accommodating the dicing tape wound in a roll shape with a part of the dicing tape reeled out is installed to be replaceably mountable, a pressing roller that is provided on the base section and presses the dicing tape to the workpiece, and a regulation section that is movable to regulate a reel-out region where the part of the dicing tape is reeled out to a predetermined track to reach the vicinity of the pressing roller.

According to this configuration, the tape magazine accommodating the dicing tape with the part thereof reeled out is replaceably mounted on the tape affixing apparatus, and the regulation section regulates the reel-out region of the dicing tape to the predetermined track, thereby making it possible to automatically switch or replace the dicing tape.

To attain the above-described object, a tape magazine according to the present invention is a tape magazine that is replaceably mountable on a tape affixing apparatus that affixes a dicing tape to a dicing frame and a workpiece, the tape magazine including a base that is replaceably mountable on the tape affixing apparatus, a feed shaft that is provided in the base and supports the dicing tape wound in a roll shape, and a winding shaft that is provided in the base and winds a separator of the dicing tape, in which the dicing tape is supported on the feed shaft and the winding shaft with its part reeled out, and a reel-out region where the part of the dicing tape is reeled out can be regulated to a predetermined track to reach the vicinity of the pressing roller of the tape affixing apparatus by a regulation section in the tape affixing apparatus.

According to this configuration, the tape magazine accommodating the dicing tape with the part thereof reeled out is replaceable mounted on the tape affixing apparatus, and the regulation section regulates the reel-out region of the dicing tape to the predetermined track, thereby making it possible to automatically switch or replace the dicing tape.

Advantageous Effect of Invention

The present invention makes it possible to automatically switch or replace a dicing tape.

DESCRIPTION OF EMBODIMENT

Figure 1:
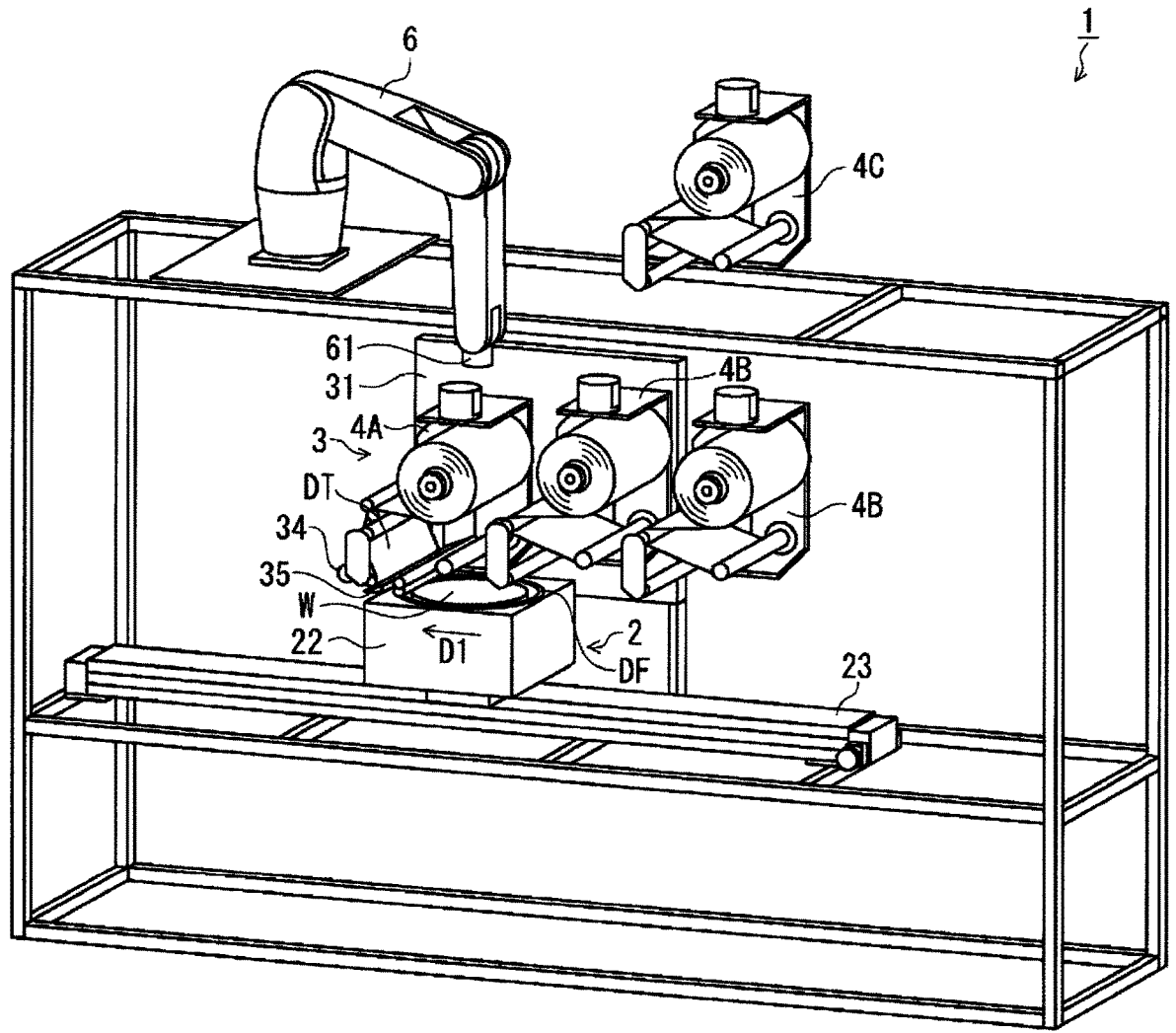
FIG. 1 is a perspective view illustrating a configuration of a tape affixing system to which a tape affixing apparatus according to an embodiment of the present invention is applied.

An embodiment of the present invention will be described with reference to the drawings. Hereinafter, when reference is made to the number of components or a numerical value, amount, range, or the like of each of the components, the number or the like is not limited to a particular number but may be the particular number or more or the particular number or less unless otherwise stated or except when expressly limited to the particular number in principle.

When reference is made to a shape of each of components or a positional relationship among the components, a substantially approximate or similar shape or the like is included unless otherwise stated or except when considered to be expressly excluded in principle.

In the drawings, there is a case where characteristic portions are exaggerated by being enlarged, for example, in order to facilitate the understanding of features, and a dimension ratio or the like of each of components is not necessarily the same as an actual one.

Figure 2:
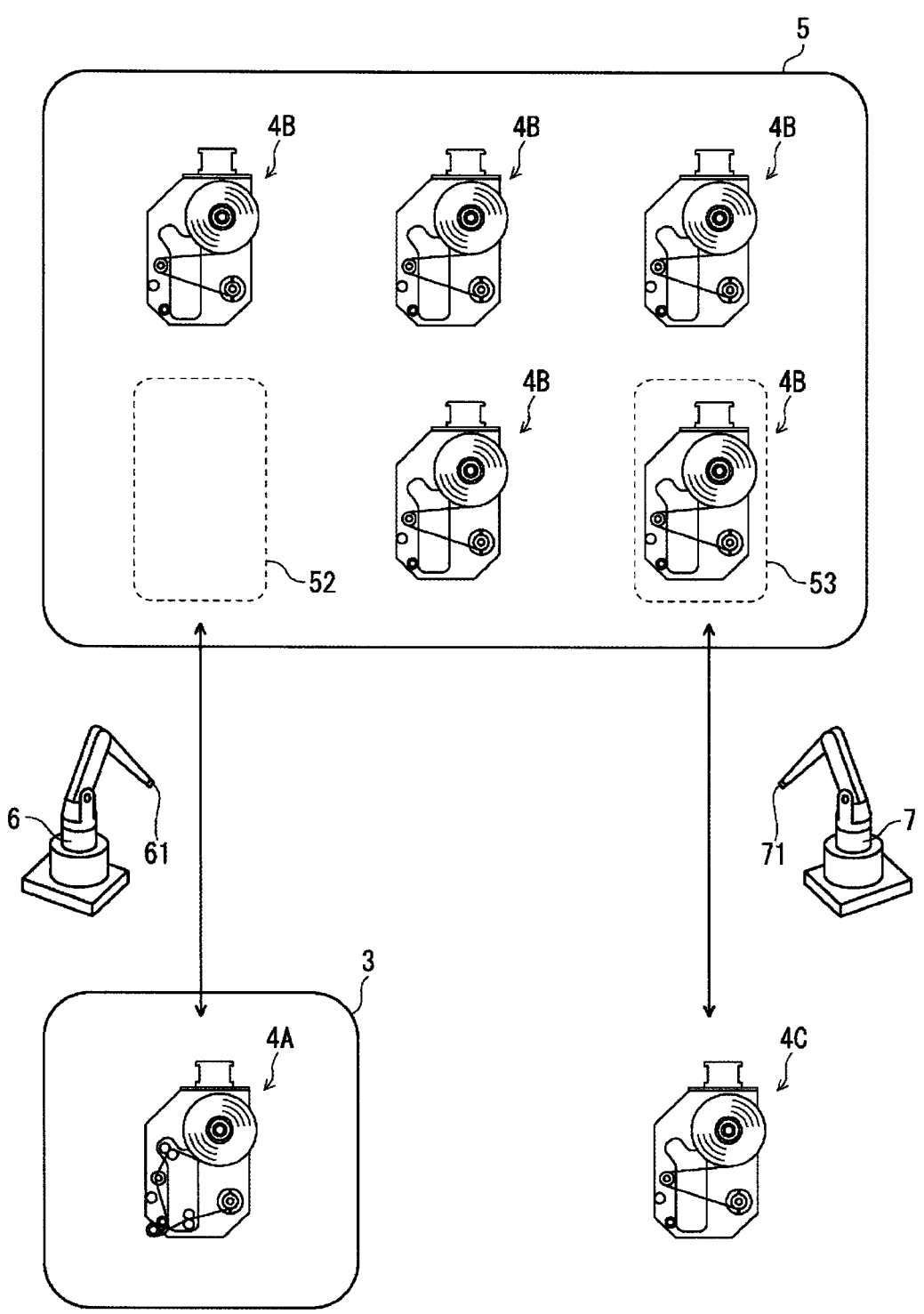
FIG. 2 is a schematic view illustrating a configuration of the tape affixing system.

As illustrated in FIGS. 1 and 2, a tape affixing system 1 affixes a dicing tape DT to a workpiece W and a dicing frame DF. The workpiece W is a semiconductor substrate such as a silicon wafer, for example, but is not limited to this. The dicing tape DT is a ultraviolet curable tape, for example.

The tape affixing system 1 includes a conveyance apparatus 2 and an affixing apparatus 3 as a tape affixing apparatus.

The conveying apparatus 2 includes an inner periphery-side table 21 that holds the workpiece W and an outer periphery-side table 22 on which the dicing frame DF is placed.

An adsorbent not illustrated composed of a porous material having an infinite number of pores is embedded in a surface of the inner periphery-side table 21. The roughness of the pores in the adsorbent is #400 or #800, for example.

The inner periphery-side table 21 is switchably connected to a vacuum source and a compressed air source not illustrated. When the vacuum source is started, a negative pressure is supplied between the workpiece W placed on the inner periphery-side table 21 and an upper surface (adsorption surface) of the adsorbent so that the workpiece W is adsorbed and held on the adsorption surface. When the compressed air source is started, compressed air (release air) is supplied between the workpiece W and the adsorption surface so that the adsorption between the workpiece W and the adsorption surface is released.

The inner periphery-side table 21 and the outer periphery-side table 22 are placed on a slider 23, and are configured to be slidable in a conveyance direction D1.

Figure 3:
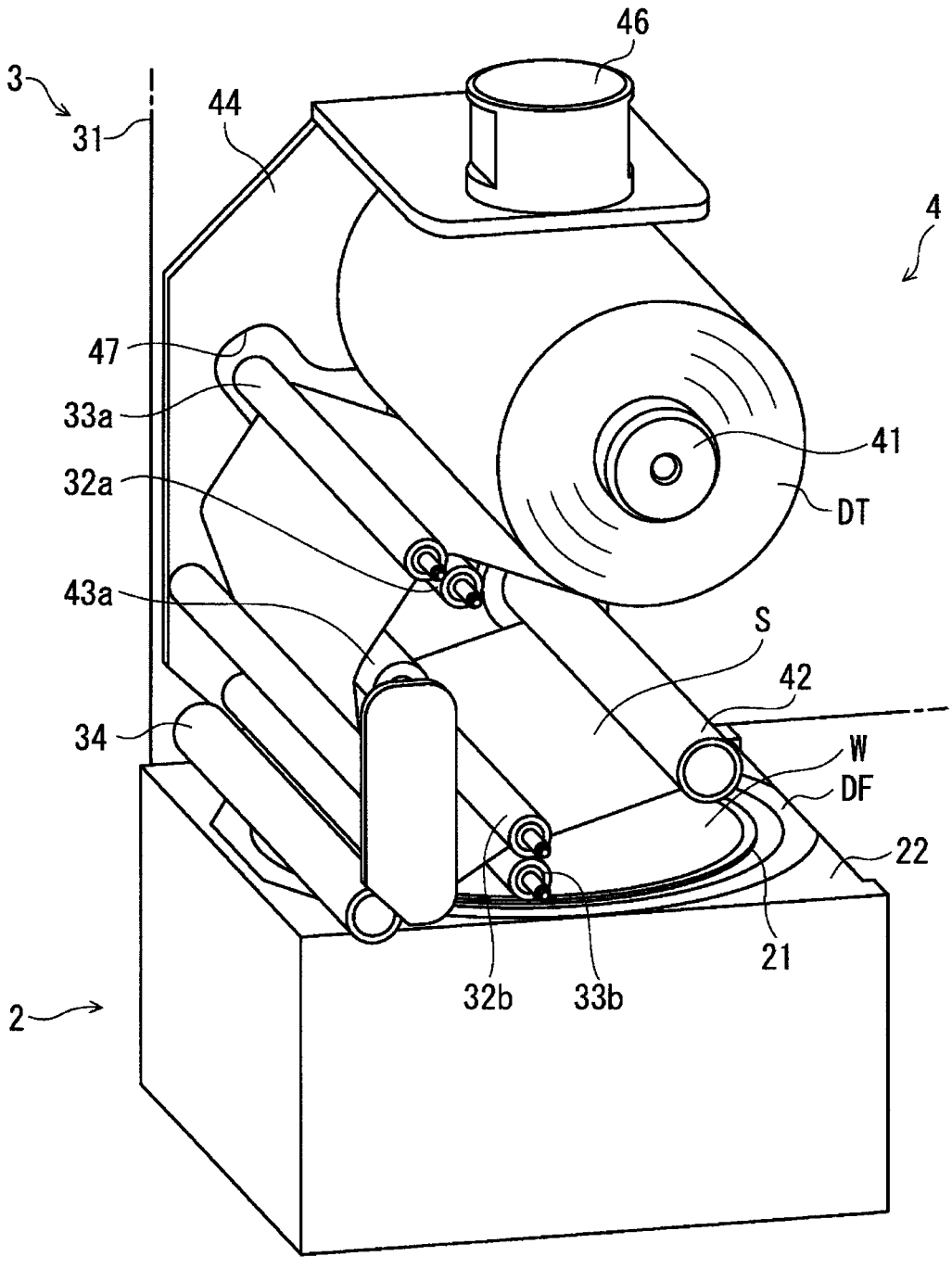
FIG. 3 is a perspective view illustrating a configuration of the tape affixing apparatus.

As illustrated in FIG. 3, the affixing apparatus 3 includes a base section 31 on which a tape magazine 4 is installed to be replaceably mountable, movable guide rollers 32a and 32b that are provided to stand from a side surface of the base section 31 and regulate a track of the dicing tape DT, fixed guide rollers 33a and 33b that are provided to stand from the side surface of the base section 31 and regulate the track of the dicing tape DT, a pressing roller 34 that moves up and down and affixes a tape main body B to the workpiece W, and a knife plate 35 that regulates a track of a separator S.

Figure 4:
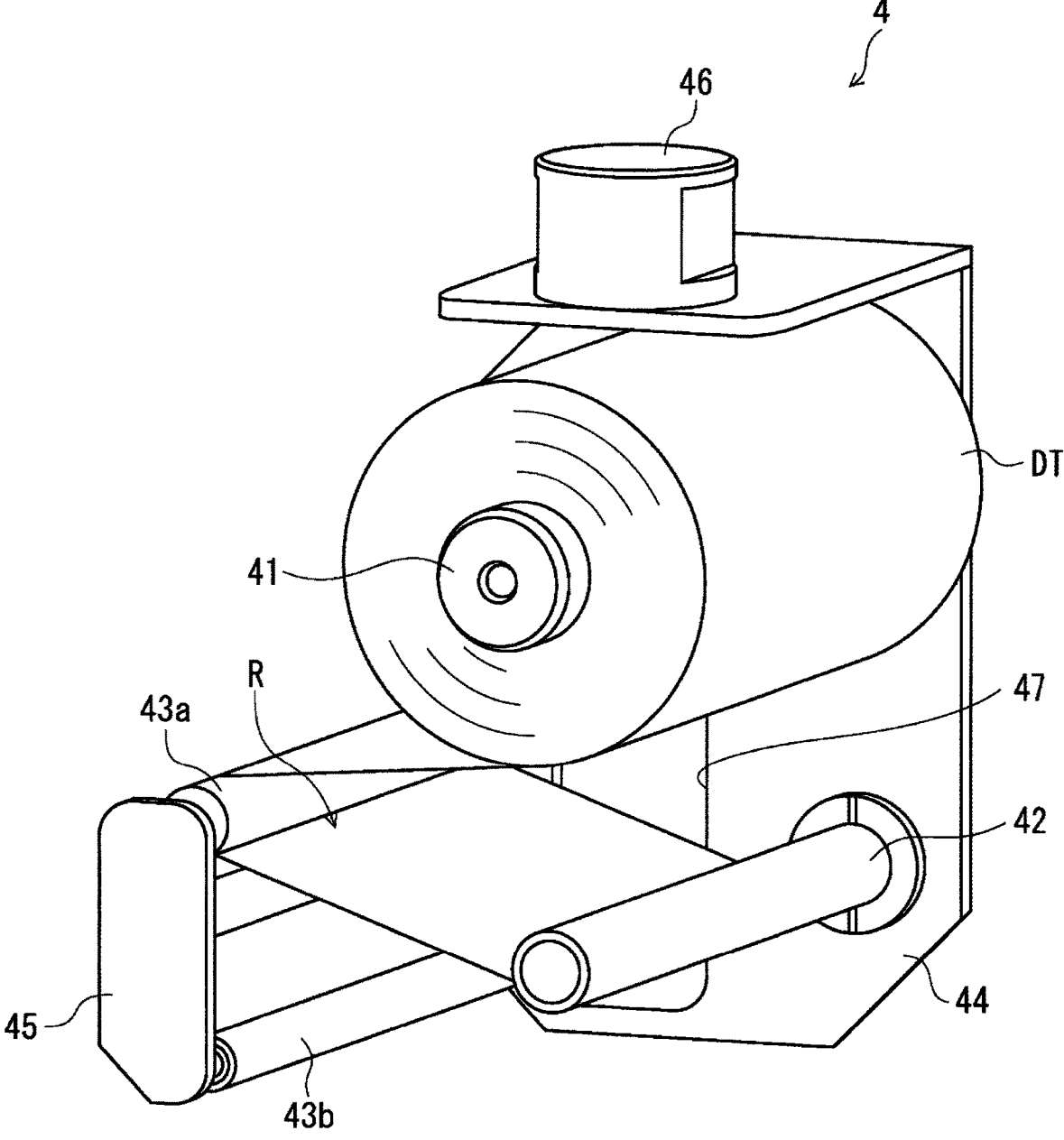
FIG. 4 is a perspective view illustrating a configuration of a tape magazine.

As illustrated in FIG. 4, the tape magazine 4 is an apparatus that accommodates a dicing tape DT wound in a roll shape with a part of the dicing tape DT reeled out and is modularized to be conveyable by a first conveyance robot 6 and a second conveyance robot 7, described below. Respective dicing tapes DT to be accommodated in tape magazines 4 may be of the same type or different types. A range where a part of the dicing tape DT is reeled out is hereinafter referred to as a "reel-out region R".

The tape magazine 4 includes a feed shaft 41 that feedably supports the roll-shaped dicing tape DT, a winding shaft 42 that winds the separator S of the dicing tape DT and applies a feeding force to the dicing tape DT, and fixed guide rollers 43a to 43b that regulate the track of the dicing tape DT to exert tension to the dicing tape DT and reel out a part of the dicing tape DT.

The feed shaft 41 is provided with a number-of-revolutions sensor that calculates the remaining amount of the dicing tape DT from the number of revolutions of the feed shaft 41 or a metal detection sensor that detects the feed shaft 41 when the amount of the dicing tape DT decreases, for example, thereby making it possible to detect that the remaining amount of the dicing tape DT decreases.

The feed shaft 41 and the winding shaft 42 are provided to stand from a side surface of a base 44, and both ends of each of the fixed guide rollers 43a and 43b are respectively supported on the base 44 and a support plate 45. An upper end of the base 44 is provided with a section to be adsorbed 46 that can be adsorbed to the first conveyance robot 6 and the second conveyance robot 7, described below. The base 44 and the base section 31 are configured to be detachably attached to each other by a locking mechanism not illustrated.

A notch section 47 is provided in a part of the base 44 and specifically between the feed shaft 41 and the winding shaft 42 and the fixed guide roller 43a as viewed from the side. The notch section 47 is set to have such a size that the movable guide rollers 32a and 32b, the fixed guide rollers 33a and 33b, and the knife plate 35 can be accommodated therein.

As illustrated in FIG. 2, the tape affixing system 1 includes a stocker 5 storing a plurality of tape magazines 4 and the first conveyance robot 6 as a delivery apparatus that delivers each of the tape magazines 4 between the affixing apparatus 3 and the stocker 5. The first conveyance robot 6 includes an adsorption section 61 that can adsorb and hold a section to be adsorbed 46 in the tape magazine 4. Hereinafter, when a tape magazine 4 attached to the affixing apparatus 3 and the tape magazine 4 stored in the stocker 5 are distinguished, the former and the latter are respectively assigned reference sign 4A and reference sign 4B.

Figure 5:
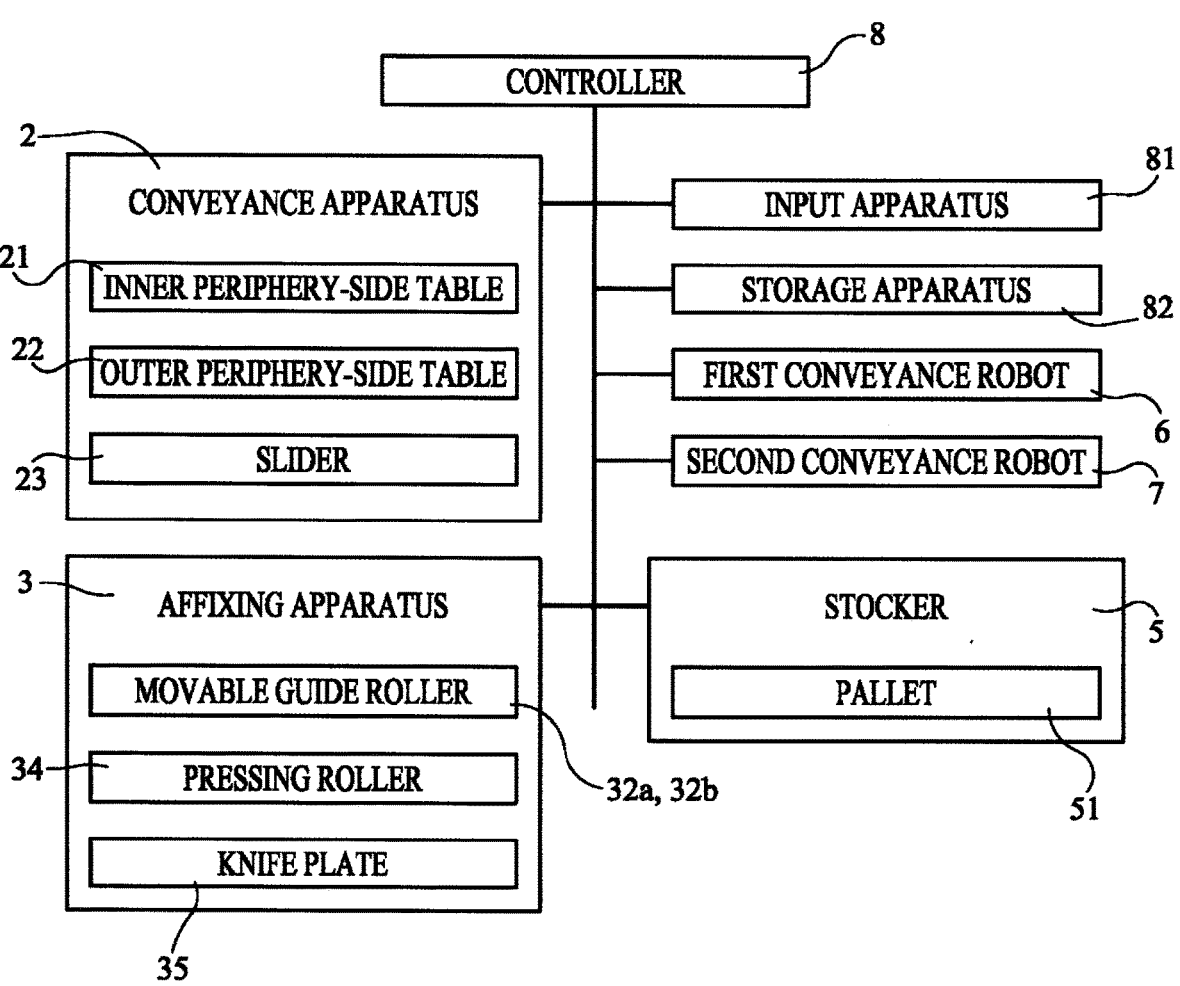
FIG. 5 is a block diagram illustrating a main configuration of the tape affixing system.
Figure 6A:
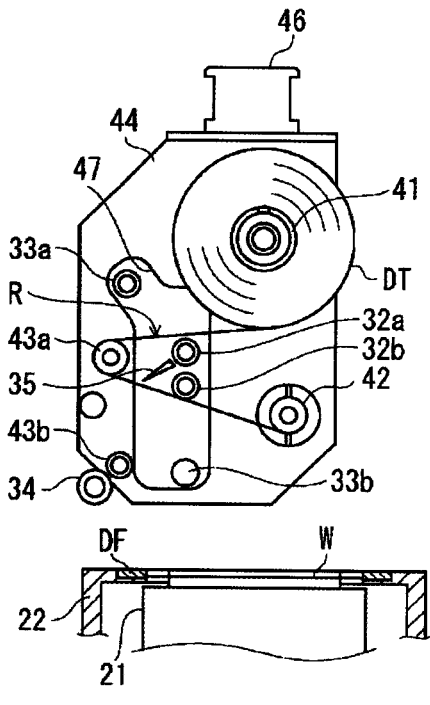
FIGS. 6*a-d* are a schematic view illustrating a procedure for automatically setting a dicing tape.
Figure 6B:
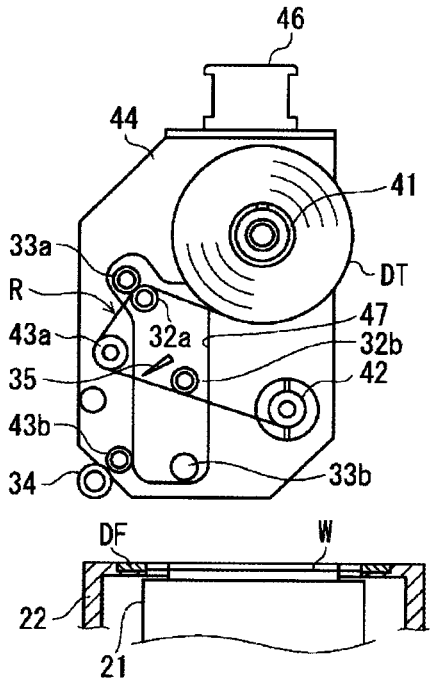
Figure 6C:
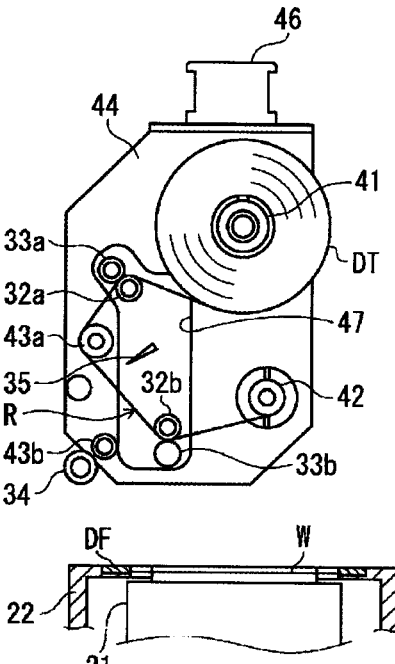
Figure 6D:
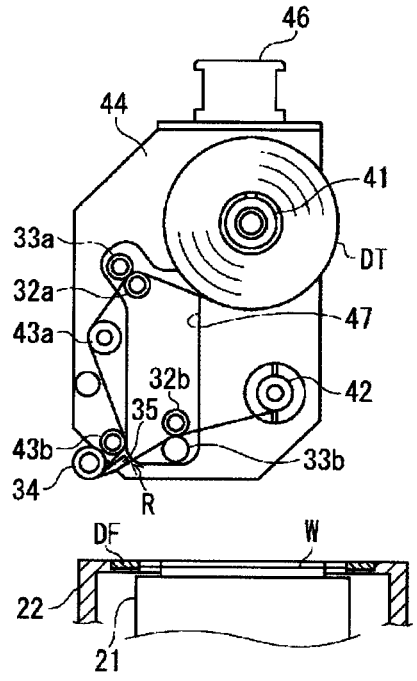

FIGS. 1 and 2 illustrate a configuration in which a pallet 51 illustrated in FIG. 5 is loaded with each of the plurality of tape magazines 4B in the stocker 5, the pallet 51 is configured to be movable in the stocker 5, and the first conveyance robot 6 holds the tape magazine 4B conveyed to a predetermined extraction position 52 in the stocker 5 and conveys the tape magazine 4B to the affixing apparatus 3.

The tape affixing system 1 includes the second conveyance robot 7 as an interchange apparatus. The second conveyance robot 7 includes an adsorption section 71 that can adsorb and hold a section to be adsorbed 46 in the tape magazine 4B in the stocker 5 or an external tape magazine 4. Hereinafter, the external tape magazine 4 is assigned reference sign 4C when distinguished from the tape magazine 4B stored in the stocker 5.

FIG. 2 illustrates a configuration in which the pallet 51 configured to be movable in the stocker 5 is loaded with each of the plurality of tape magazines 4B in the stocker 5 and the second conveyance robot 7 holds and discharges the tape magazine 4B conveyed to a predetermined interchange position 53 in the stocker 5 and then conveys the external tape magazine 4C to the interchange position 53.

The external tape magazine 4C may be any tape magazine stored in an external rack or the like or conveyed, as needed, by a conveyance apparatus or the like, for example. The stocker 5 stores the tape magazine 4B accommodating the dicing tape DT having a high usage frequency, and the external rack or the like keeps the tape magazine 4C accommodating the dicing tape DT having a low usage frequency, thereby making it possible to reduce the frequency of tape interchange. The external tape magazine 4C may be shared among a plurality of tape affixing systems 1.

An operation of the tape affixing system 1 is controlled via a controller 8 as a control apparatus. The controller 8 controls each of components constituting the tape affixing system 1. The controller 8 is a computer, for example, and includes a CPU, a memory, and the like. A function of the controller 8 may be implemented by control using software, or may be implemented by one that operates using hardware.

The controller 8 includes an input apparatus 81 and a storage apparatus 82.

The input apparatus 81 is an apparatus for calling the desired dicing tape DT by inputting a processing condition of a workpiece W, for example, and is a touch panel, for example.

The storage apparatus 82 stores respective processing conditions of a plurality of workpieces W and type information of a dicing tape DT corresponding to each of the processing conditions in association with each other. The storage apparatus 82 stores for each of tape magazines 4 type information of the dicing tape DT accommodated in the tape magazine 4, and positional information of the tape magazine 4B (e.g., a number capable of identifying the pallet 51) in the stocker 5 and positional information of the external tape magazine 4C stored in the external rack or the like. The positional information of the tape magazine 4 is updated every time the tape magazine 4 is interchanged or replaced.

Then, an operation of the tape affixing system 1 will be described with reference to the drawings.

<Workpiece Conveyance>

First, the dicing frame DF is transferred onto the outer periphery-side table 22 by a conveyance hand not illustrated, for example.

Then, a workpiece W is transferred onto the inner periphery-side table 21 by a conveyance hand not illustrated, for example. Then, when a negative pressure is supplied between the workpiece W and the adsorption surface from the compressed air source, the workpiece W is adsorbed on the inner periphery-side table 21. An upper surface of the workpiece W and an upper surface of the dicing frame DF are set to be substantially flush with each other.

<Tape Magazine Mounting>

A tape magazine 4A is mounted on the affixing apparatus 3 before or after or in parallel with workpiece conveyance. Specifically, the controller 8 first calls type information of a dicing tape DT adapted to a processing condition of a workpiece W inputted via the input apparatus 81 by an operator or the like from the storage apparatus 82 on the basis of the processing condition of the workpiece W.

Then, the controller 8 determines whether or not the dicing tape DT adapted to the processing condition of the workpiece W is required to be switched on the basis of whether or not the called type information of the dicing tape DT and type information of a dicing tape DT in the tape magazine 4A mounted on the base section 31 match each other. The controller 8 determines whether or not the dicing tape DT in the tape magazine 4A is required to be replaced on the basis of the remaining amount of the dicing tape DT.

Then, if the controller 8 determines that the dicing tape DT is required to be switched or replaced, the controller 8 performs operation control to call positional information in the stocker 5 about a tape magazine 4B accommodating the dicing tape DT from the storage apparatus 82 and move the pallet 51 storing the called tape magazine 4B to the extraction position 52.

The first conveyance robot 6 bends and stretches its arm to the vicinity of the tape magazine 4B conveyed to the extraction position 52, and the adsorption section 61 adsorbs and holds the section to be adsorbed 46.

Then, the first conveyance robot 6 bends and stretches tape magazine 4B to the vicinity of the base section 31, and the base 44 is attached to the base section 31. At this time, as illustrated in FIG. 6(*a*), the movable guide rollers 32a and 32b, the fixed guide rollers 33a and 33b, and the knife plate 35 are arranged in the notch section 47. The movable guide roller 32a and the fixed guide roller 33a are arranged on the opposite sides to each other with the dicing tape DT sandwiched therebetween, and the movable guide roller 32b and the fixed guide roller 33b are arranged on the opposite side to each other with the dicing tape DT sandwiched therebetween.

Then, as illustrated in FIG. 6(*b*), the movable guide roller 32a moves to come closer to the fixed guide roller 33a to feed the dicing tape DT upward, and the movable guide roller 32a and the fixed guide roller 33a regulate the track of the dicing tape DT in the reel-out region R with the dicing tape DT sandwiched therebetween.

Similarly, as illustrated in FIG. 6(*c*), the movable guide roller 32b moves to come closer to the fixed guide roller 33b to feed the dicing tape DT downward, and the movable guide roller 32b and the fixed guide roller 33b regulate the track of the dicing tape DT in the reel-out region R with the dicing tape DT sandwiched therebetween.

As illustrated in FIG. 6(*d*), the knife plate 35 moves to come closer to the pressing roller 34 to feed the dicing tape DT downward and regulates the track of the dicing tape DT in the reel-out region R to reach the vicinity of the pressing roller 34.

Then, the adsorption between the adsorption section 61 and the section to be adsorbed 46 is released, and the first conveyance robot 6 delivers the tape magazine 4B to the affixing apparatus 3.

Thus, the tape magazine 4 accommodating the dicing tape DT of the appropriate type depending on the inputted processing condition of the workpiece W can be delivered to the affixing apparatus 3.

When the tape magazine 4A mounted on the base section 31 is removed prior to the mounting of the tape magazine 4B, the movable guide roller 32a and 32b, the fixed guide rollers 33a and 33b, and the knife plate 35 are separated from the dicing tape DT, thereby shifting to a state where the track of the dicing tape DT is regulated by the feed shaft 41, the winding shaft 42, and the fixed guide roller 43a.

Then, the first conveyance robot 6 bends and stretches the arm to the vicinity of the tape magazine 4A mounted on the affixing apparatus 3, and the adsorption section 61 adsorbs and holds the section to be adsorbed 46. Then, the base 44 is removed from the base section 31.

Then, the first conveyance robot 6 bends and stretches tape magazine 4A to the vicinity of the extraction position 52 in the stocker 5, to place the tape magazine 4A on the pallet 51 and deliver the tape magazine 4A to the stocker 5.

Any configuration may be used if the stocker 5 and the first conveyance robot 6 supply the tape magazine 4B accommodating the dicing tape DT to be selected depending on the type of the workpiece W, for example, in cooperation with each other.

For example, a configuration may be used in which a plurality of tape magazines 4B are respectively arranged at predetermined positions in the stocker 5 and the first conveyance robot 6 bends and stretches the arm to the vicinity of the desired tape magazine 4B in the stocker 5, holds the tape magazine 4B, and conveys the tape magazine 4B to the affixing apparatus 3.

In this configuration, the controller 8 first calls positional information in the stocker 5 about the tape magazine 4B accommodating a dicing tape DT of a type adapted to a processing condition of the workpiece W from the storage apparatus 82 and feeds the positional information of the tape magazine 4B to the first conveyance robot 6, the first conveyance robot 6 bends and stretches the arm to the vicinity of the tape magazine 4B in the stocker 5, and the adsorption section 61 adsorbs and holds the section to be adsorbed 46.

Then, the first conveyance robot 6 bends and stretches the tape magazine 4 to the vicinity of the base section 31, and the base 44 is attached to the base section 31.

If the dicing tape DT of the type adapted to the processing condition of the workpiece W, for example, does not exist in the stocker 5, an external tape magazine 4C is mounted on the affixing apparatus 3 after being carried into the stocker 5.

Specifically, the controller 8 calls positional information of an external tape magazine 4C accommodating a dicing tape DT of a type adapted to a processing condition of the workpiece W, for example, from the storage apparatus 82 and feeds the positional information to the second conveyance robot 7, and the second conveyance robot 7 adsorbs and holds the external tape magazine 4C and delivers the external tape magazine 4C to the pallet 51 positioned at the interchange position 53 in the stocker 5.

Then, the controller 8 performs operation control to move the pallet 51 storing the tape magazine 4C carried into the stocker 5 to the extraction position 52. The first conveyance robot 6 bends and stretches the arm to the vicinity of the tape magazine 4C conveyed to the extraction position 52, and the adsorption section 61 adsorbs and holds the section to be adsorbed 46.

Then, the first conveyance robot 6 bends and stretches the tape magazine 4C to the vicinity of the base section 31, and the base 44 is attached to the base section 31.

Thus, the capacity of the tape magazine 4 stored in the stocker 5 can be substantially expanded, thereby making it possible to cope with a variety of types of dicing tapes DT. Further, the external tape magazine 4C can be shared among the plurality of tape affixing systems 1, thereby making it possible to effectively use the dicing tape DT.

Any configuration may be used if the stocker 5 and the second conveyance robot 7 interchange the tape magazine 4B in the stocker 5 and the external tape magazine 4C in cooperation with each other.

For example, a configuration may be used in which a plurality of tape magazines 4C are respectively arranged at predetermined positions in the stocker 5 and the second conveyance robot 7 moves to a position of the tape magazine 4B in the stocker 5 to hold the tape magazine 4B and discharge the tape magazine 4B from the stocker 5 and then carries an external tape magazine 4C into the stocker 5.

In this configuration, when the external tape magazine 4C is carried into the stocker 5, the controller 8 first calls positional information of the external tape magazine 4C accommodating a dicing tape DT of a type adapted to a processing condition of the workpiece W, for example, from the storage apparatus 82 and feeds the positional information to the second conveyance robot 7, and the second conveyance robot 7 adsorbs and holds the external tape magazine 4C and carries the external tape magazine 4C into a predetermined position in the stocker 5.

Then, the controller 8 feeds positional information of a new tape magazine 4B carried into the stocker 5 from outside to the first conveyance robot 6, the first conveyance robot 6 bends and stretches the arm to the vicinity of the tape magazine 4B carried in from outside, and the adsorption section 61 adsorbs and holds the section to be adsorbed 46.

Then, the first conveyance robot 6 bends and stretches the tape magazine 4B carried in from outside to the vicinity of the base section 31, and the base 44 is attached to the base section 31.

<Tape Affixing>

Figure 7A:
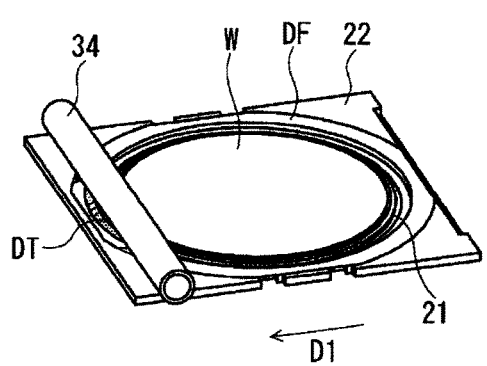
FIGS. 7*a-c* are a schematic view illustrating a procedure for affixing the dicing tape to a workpiece and a dicing frame.

Then, the slider 23 is driven, to move the inner periphery-side table 21 and the outer periphery-side table 22 such that one end (an affixing start position) of the tape main body B is arranged below the pressing roller 34, as illustrated in FIG. 7(a).

Then, the winding roller 42 rotates to feed the dicing tape DT, and the pressing roller 34 presses the tape main body B against the dicing frame DF to affix the tape main body B with a predetermined pressing force.

Figure 7B:
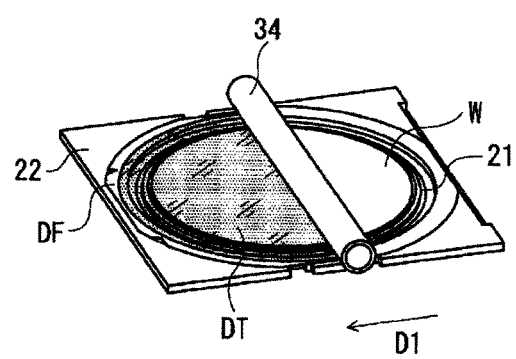

Then, when the inner periphery-side table 21 and the outer periphery-side table 22 move in the conveyance direction D1, the affixing of the tape main body B to the dicing frame DF and the workpiece W is gradually advanced, as illustrated in FIG. 7(b).

Figure 7C:
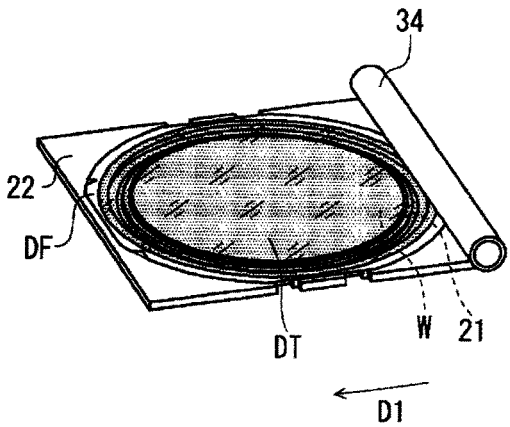

As illustrated in FIG. 7(c), when the tape main body B reaches the other end (an affixing end position) of the dicing frame DF, the workpiece W and the dicing frame DF are integrally affixed to each other with the tape main body B interposed therebetween.

Thus, the affixing apparatus 3 according to the present embodiment is the tape affixing apparatus 3 that affixes the dicing tape DT to the dicing frame DF and the workpiece W, and is configured to include the base section 31 on which the tape magazine 4 accommodating the dicing tape DT wound in a roll shape is installed to be replaceably mountable with a part of the dicing tape DT reeled out, the movable guide rollers 32a and 32b, the fixed guide rollers 33a and 33b, and the knife plate 35 that are movable to regulate the reel-out region R where the part of the dicing tape DT is reeled out to a predetermined track.

According to this configuration, when the tape magazine 4 accommodating the dicing tape DT with the part thereof reeled out is replaceably mounted on the base section 31, the movable guide rollers 32a and 32b, the fixed guide rollers 33a and 33b, and the knife plate 35 regulate the reel-out region R of the dicing tape DT to the predetermined track, thereby making it possible to automatically switch or replace the dicing tape DT.

The tape magazine 4 according to the present embodiment is the tape magazine 4 that is replaceably mountable on the affixing apparatus 3 that affixes the dicing tape DT to the dicing frame DF and the workpiece W, and is configured to include the base 44 that is replaceably mountable on the affixing apparatus 3, the feed shaft 41 that is provided in the base 44 and supports the dicing tape DT wound in a roll shape, and the winding shaft 42 that is provided in the base 44 and winds the separator S of the dicing tape DT and such that the dicing tape DT is supported on the feed shaft 41 and the winding shaft 42 with a part of the dicing tape DT reeled out and the reel-out region R where the part of the dicing tape DT is reeled out can be regulated to a predetermined track by the movable guide rollers 32a and 32b, the fixed guide rollers 33a and 33b, and the knife plate 35 in the affixing apparatus 3.

According to this configuration, when the tape magazine 4 accommodating the dicing tape DT with the part thereof reeled out is replaceably mounted on the base section 31, the movable guide rollers 32a and 32b, the fixed guide rollers 33a and 33b, and the knife plate 35 regulate the reel-out region R of the dicing tape DT to the predetermined track, thereby making it possible to automatically switch or replace the dicing tape DT.

It should be understood that various modifications can be made in addition to the foregoing without departing from the spirit of the prevent invention and the present invention covers the modifications.

Although the movable guide rollers 32a and 32b, the fixed guide rollers 33a and 33b, and the knife plate 35 have been described as an example of a regulation section that regulates the reel-out region R of the dicing tape DT to a track in the above-described embodiment, the number of regulation sections and the type of each of the regulation sections are not limited to these.

REFERENCE SIGNS LIST

1: tape affixing system
2: conveyance apparatus
21: inner periphery-side table
22: outer periphery-side table
23: slider
3: affixing apparatus (tape affixing apparatus)
31: base section
32*a*, 32*b*: movable guide roller (regulation section)
33*a*, 33*b*: fixed guide roller (regulation section)
34: pressing roller
35: knife plate (regulation section)
4, 4A, 4B, 4C: tape magazine
41: feed shaft
42: winding shaft
43*a*, 43*b*: fixed guide roller
44: base
45: support plate
46: section to be adsorbed
47: notch section
5: stocker
51: pallet
6: first conveyance robot (delivery apparatus)
61: adsorption section
7: second conveyance robot (interchange apparatus)
71: adsorption section
8: controller (control apparatus)
81: input apparatus
82: storage apparatus
B: tape main body
D1: conveyance direction
DF: dicing frame
DT: dicing tape
R: reel-out region
S: separator
W: workpiece

What is claimed is:

1. A tape affixing apparatus that affixes a dicing tape to a dicing frame and a workpiece, the tape affixing apparatus comprising:

a removable tape magazine having a base with a notch section, a feed shaft holding a roll of dicing tape and a winding shaft configured to wind and hold a separator for the dicing tape attached to the base on one side of the notch section, and a first fixed guide roller and a second fixed guide roller attached to the base on an opposing side of the notch section, wherein the first fixed guide roller is positioned between the feed shaft and the winding shaft and a reeled out portion of the roll of dicing tape passes over the notch section around the first fixed guide roller over the notch section again forming a U-shaped space of the reeled out portion extending over the notch and the separator for the dicing tape wound on the winding shaft;

a base section configured to hold said removable tape magazine;

a first movable guide roller and a second movable guide roller positioned within the U-shaped space, said first movable guide roller moveable to a position towards the feed shaft and said second movable guide roller moveable to a position towards the winding shaft, a pressing roller attached to the base section; and a knife plate configured to move towards said pressing roller, whereby the reeled out portion of the dicing tape is moved closer to said pressing roller by said knife plate affixing the dicing tape to the dicing frame and the workpiece.

2. A tape affixing apparatus according to claim 1 further comprising:

a third fixed guide roller attached to said base section and positioned outside of the U-shaped space on a side of the U-shaped space with the feed shaft, and a fourth fixed guide roller positioned outside of the U-shaped space on a side of the U-shaped space with the winding shaft, whereby said first movable guide roller is capable of being positioned adjacent said third fixed guide roller and said second movable guide roller is capable of being positioned adjacent said fourth fixed guide roller.

* * * * *